(12) United States Patent
Yamagishi et al.

(10) Patent No.: US 11,380,522 B2
(45) Date of Patent: Jul. 5, 2022

(54) RADICAL DEACTIVATION COMPONENT, PLASMA PROCESSING APPARATUS USING THE SAME AND RADICAL DEACTIVATION METHOD

(71) Applicant: Tokyo Electron Limited, Tokyo (JP)

(72) Inventors: Koji Yamagishi, Miyagi (JP); Shota Sasaki, Miyagi (JP); Shinji Maekawa, Miyagi (JP); Daisuke Yoshikoshi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 310 days.

(21) Appl. No.: 16/416,681

(22) Filed: May 20, 2019

(65) Prior Publication Data
US 2019/0362939 A1    Nov. 28, 2019

(30) Foreign Application Priority Data
May 25, 2018  (JP) .............................. JP2018-100710

(51) Int. Cl.
| | |
|---|---|
| *H01J 37/32* | (2006.01) |
| *B01D 53/76* | (2006.01) |
| *B01D 53/38* | (2006.01) |
| *C23C 16/455* | (2006.01) |
| *C23C 16/50* | (2006.01) |
| *G01L 9/00* | (2006.01) |
| *F16L 23/00* | (2006.01) |
| *C23C 16/40* | (2006.01) |

(52) U.S. Cl.
CPC .......... *H01J 37/3244* (2013.01); *B01D 53/38* (2013.01); *B01D 53/76* (2013.01); *C23C 16/401* (2013.01); *C23C 16/45544* (2013.01); *C23C 16/45561* (2013.01); *C23C 16/50* (2013.01); *F16L 23/006* (2013.01); *G01L 9/0072* (2013.01); *H01J 2237/006* (2013.01); *H01J 2237/334* (2013.01)

(58) Field of Classification Search
USPC ........................................ 156/345.24, 345.26
See application file for complete search history.

(56) References Cited

U.S. PATENT DOCUMENTS

| | | | | |
|---|---|---|---|---|
| 6,443,015 B1 * | 9/2002 | Poulin | ................. | G01L 19/0636 73/724 |
| 6,901,808 B1 * | 6/2005 | Sharpless | .............. | G01L 9/0072 73/718 |
| 6,993,973 B2 * | 2/2006 | Lischer | ................. | G01L 9/0075 361/280 |
| 7,252,011 B2 * | 8/2007 | Traverso | ............. | G01L 19/0636 361/283.4 |
| 7,443,169 B2 * | 10/2008 | Bjorkman | ............... | C23C 14/54 324/460 |
| 7,871,587 B2 | 1/2011 | Gu et al. | | |
| 9,228,913 B2 * | 1/2016 | Ishihara | .............. | G01L 19/0627 |
| 10,107,315 B2 * | 10/2018 | Gu | ...................... | G01L 19/0007 |

(Continued)

FOREIGN PATENT DOCUMENTS

JP    2006-005008    1/2006

*Primary Examiner* — Ram N Kackar
(74) *Attorney, Agent, or Firm* — IPUSA, PLLC

(57) ABSTRACT

An article for use in a plasma processing apparatus includes a gas supply pipe, and a component disposed in the gas supply pipe. The component is configured to cause radicals of gas passing through the gas supply pipe to be deactivated in the component.

17 Claims, 7 Drawing Sheets

(56) References Cited

U.S. PATENT DOCUMENTS

| | | | |
|---|---|---|---|
| 2008/0110269 A1* | 5/2008 | Strietzel | G01L 19/0627 73/718 |
| 2012/0212136 A1* | 8/2012 | Einav | H01J 37/321 315/111.41 |
| 2014/0130743 A1* | 5/2014 | Toriya | C23C 16/4412 118/725 |
| 2016/0281226 A1* | 9/2016 | Moroi | C23C 16/52 |
| 2016/0343580 A1* | 11/2016 | Hudson | H01J 37/32091 |
| 2016/0365260 A1* | 12/2016 | Iwao | H01L 21/6708 |
| 2017/0287677 A1* | 10/2017 | Kato | H01J 37/32715 |

* cited by examiner

RADICAL DEACTIVATION COMPONENT, PLASMA PROCESSING APPARATUS USING THE SAME AND RADICAL DEACTIVATION METHOD

CROSS-REFERENCE TO RELATED APPLICATION

The present application is based on and claims priority to Japanese Priority Application No. 2018-100710 filed on May 25, 2018, the entire contents of which are hereby incorporated herein by reference.

BACKGROUND OF THE INVENTION

1. Field of the Invention

The present disclosure relates to a radical deactivation component, a plasma processing apparatus using the same, and a radical deactivation method.

2. Description of the Related Art

As described in U.S. Pat. No. 7,871,587, a trapping device traps a by-product produced in an exhaust system of a film deposition process in a gas flow path having a helical shape to prevent clogging of the exhaust system.

The present disclosure relates to a radical deactivation component, a plasma processing apparatus using the same and a radical deactivation method.

SUMMARY OF THE INVENTION

The present disclosure provides a radical deactivation component, a plasma processing apparatus using the same and a radical deactivation method that can prevent deposits from adhering to a measuring instrument and the like connected to a processing chamber via a pipe when performing a film deposition process using plasma.

According to an embodiment, there is provided an article for use in a plasma processing apparatus includes a gas supply pipe, and a component disposed in the gas supply pipe. The component is configured to cause radicals of gas passing through the gas supply pipe to be deactivated in the component.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Embodiments of the present disclosure are described below with reference to accompanying drawings.

[Overview of Overall Configuration]

Figure 1:
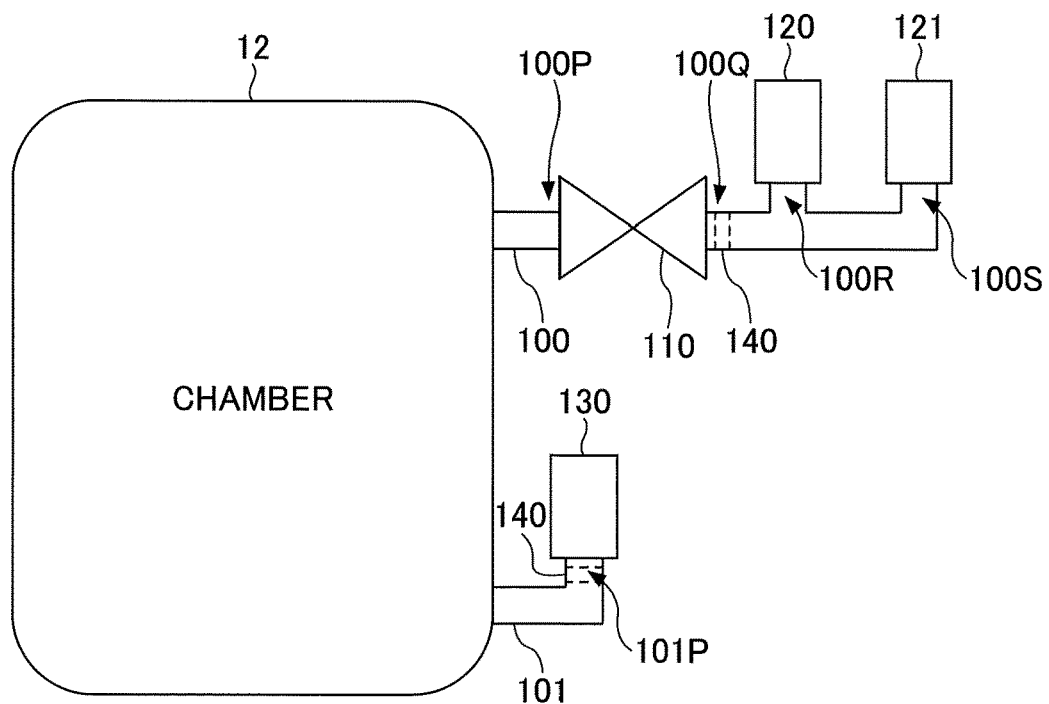
FIG. 1 a diagram illustrating an example of a place where a radical deactivation component can be installed in a plasma processing apparatus according to an embodiment of the present disclosure.

FIG. 1 is a diagram illustrating examples of locations where a radical deactivation component 140 according to an embodiment of the present disclosure can be installed in a plasma processing apparatus according to an embodiment of the present disclosure.

In FIG. 1, the plasma processing apparatus according to this embodiment includes a processing chamber 12, pipes 100 and 101, an isolation valve 110, capacitance manometers 120 and 121, a pressure determination switch 130, and a radical deactivation component 140. More specifically, capacitance manometers 120 and 121 are connected to the processing chamber 12 via the pipe 100 and the isolation valve 110, and the radical deactivation component 140 is provided in the pipe 100 downstream of the isolation valve 110 and upstream of the capacitance manometers 120 and 121. Similarly, the pressure determination switch 130 is also connected to the processing chamber 12 via the pipe 101, and a radical deactivation component 140 is provided in the pipe 101 upstream of the pressure determination switch 130.

The processing chamber 12 is provided to accommodate a substrate such as a semiconductor wafer (hereinafter referred to as a "wafer W") thereinside and to perform plasma processing, such as a film deposition process, on an accommodated substrate.

The capacitance manometers 120 and 121 are pressure measuring instruments for measuring gas pressure in the processing chamber 12. The capacitance manometers 120 and 121 may be provided for high vacuum and low vacuum separately from each other. In FIG. 1, an exemplary configuration is illustrated in which a low vacuum capacitance manometer 120 and a high vacuum capacitance manometer 121 are provided separately from each other. The capacitance manometers 120 and 121 are connected to the processing chamber 12 via the pipe 100 and isolation valve 110 and are configured to switch between a connection state and a shut-off state of the capacitance manometers 120 and 121 and the processing chamber 12 by isolation valves 110. The radical deactivation component 140 is a component for deactivating radicals passing through the pipes 100 and 101 and converting the radicals to non-radicals, which are normal gases.

Here, because the gas pressure in the processing chamber 12 is measured while the isolation valve 110 is opened and the capacitance manometers 120 and 121 and the processing chamber 12 are in communication with each other, the gas in the processing chamber 12 is measured to be reachable to the capacitance manometers 120 and 121.

Figure 2:
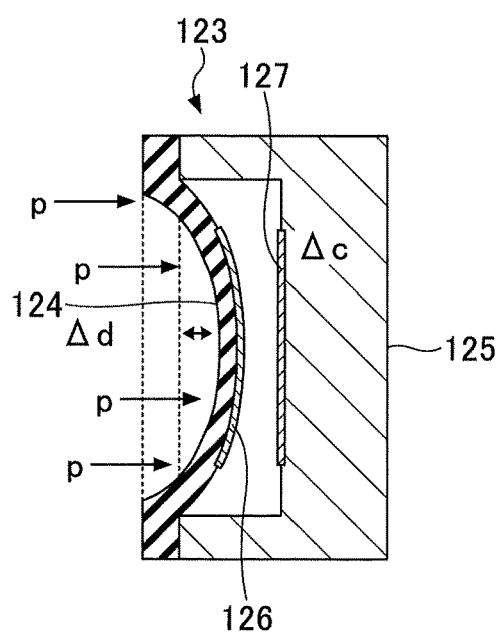
FIG. 2 is a diagram illustrating an example of a pressure detector disposed in a capacitance manometer.

FIG. 2 is a diagram illustrating an example of a pressure detector 123 disposed within the capacitance manometers 120 and 121. As shown in FIG. 2, a pressure detector 123 disposed within capacitance manometers 120 and 121 includes a diaphragm 124 and a frame 125. A moving electrode 126 is provided on the surface opposite the processing chamber 12 of the diaphragm 124, and a fixed electrode 127 is provided on the inner wall surface opposite the moving electrode 126 of the frame 125. As the diaphragm 124 moves, the capacitance between the moving electrode 126 and the fixed electrode 127 varies, and the pressure in the processing chamber 12 is measured according to the change in capacitance. Accordingly, in order to accurately measure the pressure, zero point adjustment is naturally performed in the initial state when the pressure is zero.

However, when a plasma-based deposition process is performed in the processing chamber 12, the same deposits as the thin films formed by the deposition process may be deposited on the diaphragm 124 of the capacitance manometers 120 and 121. Then, due to the effect of deposits on the diaphragm 124, a zero point shift may occur in the capacitance manometers 120 and 121. This is because, when the film deposition process is performed in the processing chamber 12, a precursor, such as a silicon-containing gas, and a reaction assist gas, such as an oxidized gas, are supplied to the substrate to deposit the reaction product (e.g., a silicon oxide film) thereon, but these gases reach the diaphragm 124 through the pipe 100, and the reaction product is deposited on the diaphragm 124.

As explained in the U.S. Pat. No. 7,871,587, there is a trap for removing deposits generated in the exhaust system, but the gas needs to reach the diaphragm 124 to measure the pressure when using a meter such as the capacitance manometer 120 and 121. That is, while traps in the exhaust system do not cause a major problem by lowering the conductance of the gas, when a meter such as the capacitance manometers 120 and 121 is used, the deposit must be prevented from depositing on the diaphragm 124, and zero point shifting must be prevented without reducing the conductance of the gas.

Here, the inventors have found that deposition on the diaphragm 124 occurs when the reaction assist gas reaches the diaphragm 124 in a radical state, but that the deposition on the diaphragm 124 does not occur when the reaction assist gas reaches the diaphragm 124 in an inactivated state.

Accordingly, in the plasma processing apparatus according to the present embodiment, the radical deactivation component 140 is provided in the pipe 100 and 101 to deactivate the radicals of the reaction assist gas without lowering the conductance of the gas to prevent deposition on the diaphragm 124. This prevents zero point shifting of the capacitance manometers 120 and 121. That is, for example, while the silicon oxide film is deposited, the radicals or oxygen radicals of the oxidation gas, which are the reaction assist gas, are deactivated to prevent the deposition of the by-product of the silicon oxide film on the diaphragm 124.

In FIG. 1, the radical deactivation component 140 is illustrated at a location 100Q downstream of isolation valve 110 in the pipe 100, but it is possible to deactivate the reaction assist gas radicals at any location within the pipe 100 upstream of capacitance manometers 120 and 121. Thus, the radical deactivation component 140 can be provided in various locations depending on the intended use. However, because it is preferable to provide the radical deactivation component 140 in the flange joint that connects the pipe components to each other for easy installation and maintenance, FIG. 1 illustrates such positions 100P to 100S where the flange joint is provided. For example, because both ends of the isolation valve 110 are connected to the pipe 100 via the flange joint, radical deactivation component 140 can be provided at positions 100P and 100Q at both ends of the isolation valve 110. Similarly, because capacitance manometers 120 and 121 are also connected to the pipe 100 via the flange joint, the radical deactivation component 140 can be preferably provided upstream of the capacitance manometers 120 and 121. When the radical deactivation components 140 are provided at positions 100R and 100S upstream of the capacitance manometers 120 and 121, it is preferable to provide the radical deactivation components 140 at the two positions 100R and 100S, respectively, in order to protect the capacitance manometers 120 and 121, respectively.

Similarly, the radical deactivation component 140 can be preferably provided at the position 101P where the flange joint is provided upstream of the pressure determination switch 130. Here, the pressure determination switch 130 is a switch that turns on when the pressure inside the processing chamber 12 reaches the set pressure, and outputs a contact signal. For example, when the pressure determination switch 130 is used as an atmospheric/vacuum determination pressure switch, the pressure determination switch 130 determines whether the inside of the processing chamber 12 is in a vacuum or atmospheric pressure state, and turns on when the predetermined vacuum pressure is set, and outputs a contact signal. For example, when the pressure determination switch 130 is used as a low vacuum/high vacuum determination pressure switch, a predetermined threshold value is preset to determine whether the pressure is in a low vacuum state or a high vacuum state, and is turned on when the pressure in the processing chamber 12 reaches a set threshold value to output a contact signal. As described above, the pressure determination switch 130 is a measuring instrument that needs to reach the pressure detection portion of the pressure determination switch 130 without lowering the conductance of the gas for pressure measurement and needs to prevent deposition on the pressure detection portion for accurate pressure measurement and determination.

Therefore, it is preferable to provide the radical deactivation component 140 according to the present embodiment in the flange joint at a position 101P upstream of the pressure determination switch 130. Here, as will be described in detail below, standardized flange joints such as a NW flange can be used as the flange joints of the positions 100P to 100S and 101P, and the radical deactivation component 140 can be provided inside the standardized flange joints. Therefore, the radical deactivation component 140 according to the present embodiment can be used with high versatility, and can be provided in multiple stages in the same paths in the pipes 100 and 101.

[Radical Deactivation Component]

Next, a specific configuration of the radical deactivation component 140 is described below.

Figure 3:
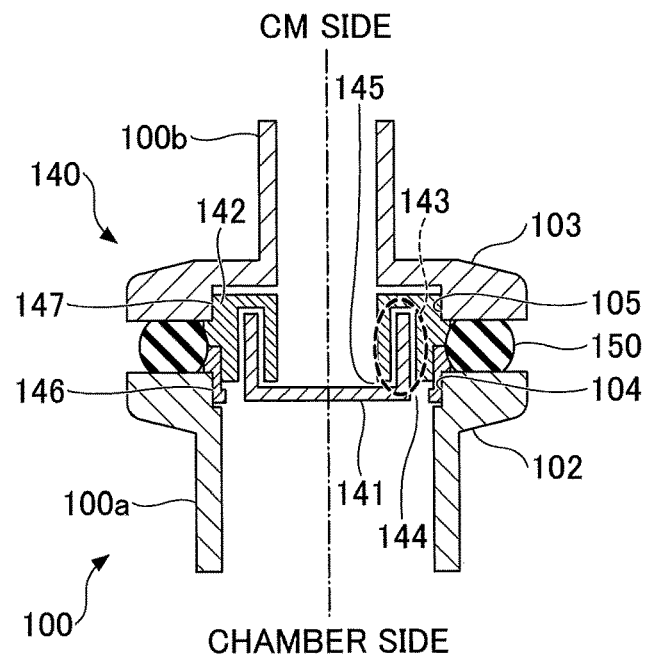
FIG. 3 is a cross-sectional view illustrating an example of a radical deactivation component according to a first embodiment.

FIG. 3 is a cross-sectional view illustrating an example of a radical deactivation component 140 according to a first embodiment. As illustrated in FIG. 3, an O-ring 150 is provided between opposing surfaces of flange joints 102 and 103, and pipe components 100a and 100b are connected together to form a pipe 100 as a whole. In FIG. 3, the pipe component 100a is disposed on a side of the processing chamber 12, and the pipe component 100b is disposed on a side of the capacitance manometers 120 and 121. Flange joints 102 and 103 may be standard flange joints 102 and 103 standardized, for example, in ISO standards, and NW flanges are illustrated as an example in FIG. 3.

A radical deactivation component 140 is provided in the flange joints 102 and 103. The radical deactivation component 140 includes a first component 141 and a second component 142 opposite to each other, and the opposing portion is configured as a bending path 143. The bending path 143 has an inlet 144 and an outlet 145 configured as a curved conduit-shaped path communicating the inlet 144 with the outlet 145. The bent shape causes the radicals to collide with the flat surface several times, and gradually deactivates the radicals. That is, the radical deactivation component 140 is configured to cause the radicals that enter the bending path 143 from the inlet 144 to reduce the energy of the radicals as the radicals collide with a plurality of planar surfaces, thereby deactivating the radicals to form a normal gas when the radicals reach the outlet 145. That is, the radicals passing through the pipe 100 from the processing chamber 12 side is guided from the inlet 144 into the bending path 143. In the bending path 143, a flat surface with which the radicals can collide is provided, and the radicals directed into the bending path 143 are guided to collide with the flat surface and to reduce its energy by colliding with the flat surface. When the radicals reach the exit 145 of the bending path 143, the radicals are deactivated by colliding with the flat surface and other wall surfaces in the bending path 143 and discharged from the exit 145 toward the capacitance manometers 120 and 121 of the tube 110. Thus, a normal gas converted from the radicals by being inactivated is delivered to capacitance manometers 120, 120 and 121, thereby preventing deposits from attaching to the diaphragm 124 of capacitance manometers 120 and 121.

In FIG. 3, a labyrinth structure is adopted such that the radicals collide with the flat surface multiple times. However, in a configuration that causes a collision between the radicals and the wall, the bending path 143 may be of various configurations and may not be necessarily a labyrinth structure. Also, the walls where radicals can collide can be of various configurations, depending on the degree of deactivation, as long as there is a flat surface. For example, if radicals are deactivated in a single collision with one flat surface, then the radicals deactivation component 140 may be configured to have a single flat surface. If multiple collisions are required for radical deactivation, the radical deactivation component 140 is configured to generate the collisions at least the required number of times for deactivation of the radicals. For example, the labyrinth structure can adjust the number of collisions between the radicals and the wall by adjusting the number of turns. Here, the flat surface means a flat wall surface, which may have a flat shape but does not include a flat surface having a plurality of holes, such as a mesh shape. In addition, the wall surface, such as the helical shape, has a curved surface, which is not included in the flat surface. These shapes do not cause a frontal collision with the radicals. That is, in the case of a mesh wall, the radicals pass through a hole, and in the case of a helical shape, the radicals are less effective in deactivating the radicals because the proportion of gas flowing along the helical shape is high. On the other hand, by including a flat surface that blocks the direction in which the radicals proceed and causes a frontal collision with the radicals as in the bending path 143 of the radical deactivation component 140 according to the present embodiment, the radicals can be efficiently deactivated.

In the case of FIG. 3, the radicals entering from the inlet 144 travels along the longitudinal direction of the pipe 100, collides at least once with the wall surface on the capacitance manometers 120 and 121 side, and then collides at least once with the wall surface of the processing chamber 12 as it travels along the longitudinal direction back to the processing chamber 12 side, thereby discharging the deactivated reaction assist gas from the outlet 145. In such a bending path 143, the minimum number of collisions with the flat surfaces is set to two times, but even in the path along the longitudinal direction, it is considered that there are multiple collisions with the side wall having the cylindrical shape and that the radicals are effectively deactivated.

Also, the gas path of the bending path 143 has a space so as not to decrease conductance and is configured to have a size so as not to interfere with the gas flow.

FIG. 3 illustrates a bending path 143 having an inlet 144 on the outer peripheral side of the pipe 100 in a radial direction, an outlet 145 on the central side of the pipe 100 in the radial direction, and a pipe structure to cause radicals to head from the outer periphery toward the center. However, the bending path 143 can be of various configurations as long as the bending path 143 can efficiently deactivate the radicals. However, in the example of FIG. 3, because the pipe component 100a closer to the processing chamber 12 has a larger diameter than the pipe component 100b closer to the capacitance manometer 120 and 121, the bending path 143 is configured to fit to the diameter of the piping parts 100a and 100b. Accordingly, the bending path 143 may be configured to have a pipe structure that extends from the outer periphery toward the center in the radial direction.

The radical deactivation component 140 is composed of a first component 141 and a second component 142, but the outer peripheries of the first and second component 141 and 142 include engagement components 146 and 147, and are configured to engage the inner peripheral portions 104 and 105 of the flange joints 102 and 103. This allows for easy installation and maintenance of the radical deactivation component 140 in the flange joints 102 and 103.

FIG. 3 illustrates the engagement component 146 and the center portion of the second component 142 apart from each other. However, the center portion of the second component 142 is connected to the engagement component 146 at other portions other than the cross section of FIG. 3. Thus, the engagement component 146 and the second component 142 have no problem with the engagement and support.

FIG. 3 illustrates an example of a radical deactivation component 140 constituted of two small components, the first component 141 and the second component 142, but the first component 141 and second component 142 may be welded together and formed integrally. However, in view of disassembly and installation, because it is convenient to form the radical deactivation component 140 of two separate components similar to the flange joints 102 and 103, the radical deactivation component 140 may have such a configuration. In this case, as illustrated in FIG. 3, the first component 141 and the second component 142 are preferably configured to face each other to form the bending path 143.

Figure 4:
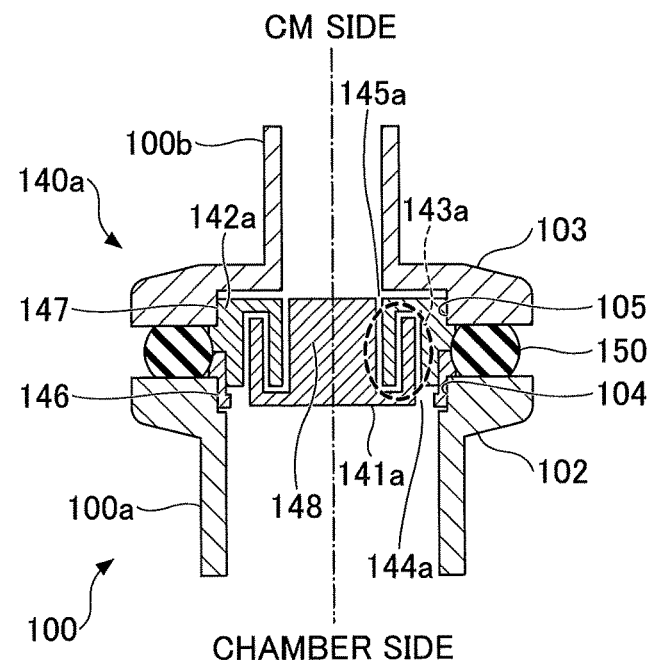
FIG. 4 is a cross-sectional view illustrating an example of a radical deactivation component according to a second embodiment.

FIG. 4 is a cross-sectional view illustrating an example of a radical deactivation component 140a according to a second embodiment. The radical deactivation component 140a according to the second embodiment differs from the radical deactivation component 140 according to the first embodiment in that a central protrusion 148 is provided in the first component 141a to increase one folding path in the bending path 143. Accordingly, the locations of the bending path 143a, the inlet 144a and outlet 145a are slightly different from the locations of the bending path 143, the inlet 144 and the outlet 145 according to the first embodiment. However, the basic structure is the same as the radical deactivation component 140 according to the first embodiment except for an increase of one return path, and the structure of the engagement portions 146 and 147 with the inner peripheries 104 and 105 in the flange joints 102 and 103 are the same as the radical deactivation component 140 according to the first embodiment.

The radical deactivation component 140a according to the second embodiment can enhance the effect of radical deactivation by increasing the single folding path (zigzag path) of the bending path 143a. Therefore, if the radical deactivation effect is insufficient in the radical deactivation component 140 according to the first embodiment, the radical deactivation component 140a according to the second embodiment can be preferably used.

Figure 5:
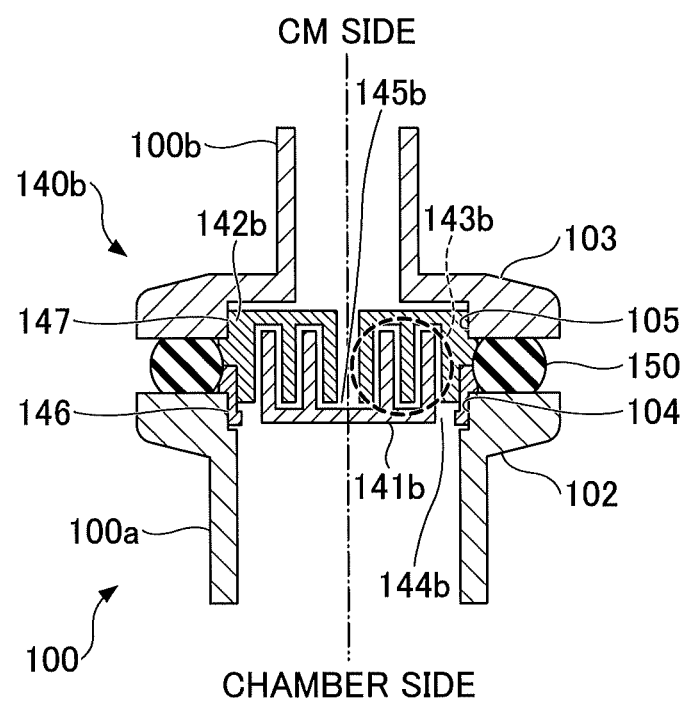
FIG. 5 is a cross-sectional view illustrating an example of a radical deactivation component according to a third embodiment.

FIG. 5 is a cross-sectional view illustrating an example of a radical deactivation component 140b according to a third embodiment. The radical deactivation component 140b according to the third embodiment has one more folding path in the bending path 143b than the radical deactivation component 140a according to the second embodiment. Regarding the shape of the bending path 143b, a reciprocating folding path is added to the center side of the radical deactivation component 140 according to the first embodiment, and one radical collision flat surface in the longitudinal direction of the piping 100 is added. Also, because there are two more collision surfaces on the lateral side, the radical deactivation effect is greatly increased compared to the radical deactivation component 140 according to the first embodiment. Furthermore, the radical deactivation effect is also increased due to the increase of one reciprocating pathway compared to the radical deactivation component 140a according to the second embodiment.

According to the radical deactivation component 140b according to the third embodiment, the effect of radical deactivation can be further enhanced by further increasing the folding path of the bending path 143a and further increasing the surface with which the radicals can collide from the front. Therefore, if the radical deactivation effect is insufficient in the radical deactivation components 140 and 140a according to the first and second embodiments, the radical deactivation components 140b according to the third embodiment can be preferably used.

Thus, as described with reference to the radical deactivation components 140, 140a and 140b according to the first to third embodiments, the bending paths 143, 143a and 143b that deactivate the radicals can be configured to increase or decrease the degree of deactivation by increasing or decreasing the folding path, so that the degree of deactivation may be varied depending on the required degree of deactivation.

In the radical deactivation components 140, 140a and 140b according to the first to third embodiments, the radical deactivation component 140 according to the first embodiment has the best gas conductance; the radical deactivation component 140a according to the second embodiment has the second best conductance; and the radical deactivation component 140b according to the third embodiment has the lowest gas conductance. The radical deactivation components 140, 140a and 140b according to the first to third embodiments are set to have the conductance that does not negatively affect the measurement of the physical quantity such as a pressure measurement in the processing chamber 12. However, the higher the conductance, the higher the response when measured, and the time delay until the value to be measured is shortened in the measurement using the measuring instrument. In other words, because there is a trade-off between the conductance and radical deactivation effects, it is preferable to form the bending paths 143, 143a and 143b as short as possible as long as the effect of radical deactivation is sufficiently obtained when weighing responsiveness. Thus, the specific configuration of the bending paths 143, 143a and 143b of the radical deactivation components 140, 140a and 140b can be determined while considering both the required degree of deactivation and the conductance (or responsiveness).

Also, because the radical deactivation components 140, 140a and 140b according to the first to third embodiments can be applied to the flange joints 102 and 103, such as the standardized NW flange, the radical deactivation components 140, 140a and 140b can be introduced with high versatility and low cost. Further, because the standardized flange joints 102 and 103 are easy to connect, the flange joints 102 and 103 can be easily provided in multiple stages, and multiple radical deactivation components 140, 140a and 140b can be easily provided in the same pipe 100 and 101 in multiple stages.

Additionally, the radical deactivation components 140, 140a and 140b are composed of two or more components, which makes it easier to disassemble the radical deactivation components 140, 140a and 140b and to facilitate installation and maintenance of the radical deactivation components 140, 140a and 140b.

In FIG. 3, a configuration of providing the radical deactivation components 140, 140a and 140b according to the first to third embodiments is illustrated in the flange joints 102 and 103. However, the radical deactivation components 140, 140a and 140b may be provided integrally with the pipe 100 by fixing the radical deactivation components 140, 140a and 140b in a pipe component, and the pipe component may be installed in the pipe 100 by disposing the pipe component between the flange joints 102 and 103.

Thus, the radical deactivation components 140, 140a and 140b according to the present embodiment can be provided in various ways within the pipe 100 and 101 between the meter and the processing chamber 12 to prevent deposition depending on the intended use.

Next, an example of applying a radical deactivation component according to the present embodiment to a plasma processing apparatus that performs etching and film deposition in the same processing chamber is described below.

[Plasma Processing Apparatus]

Figure 6:
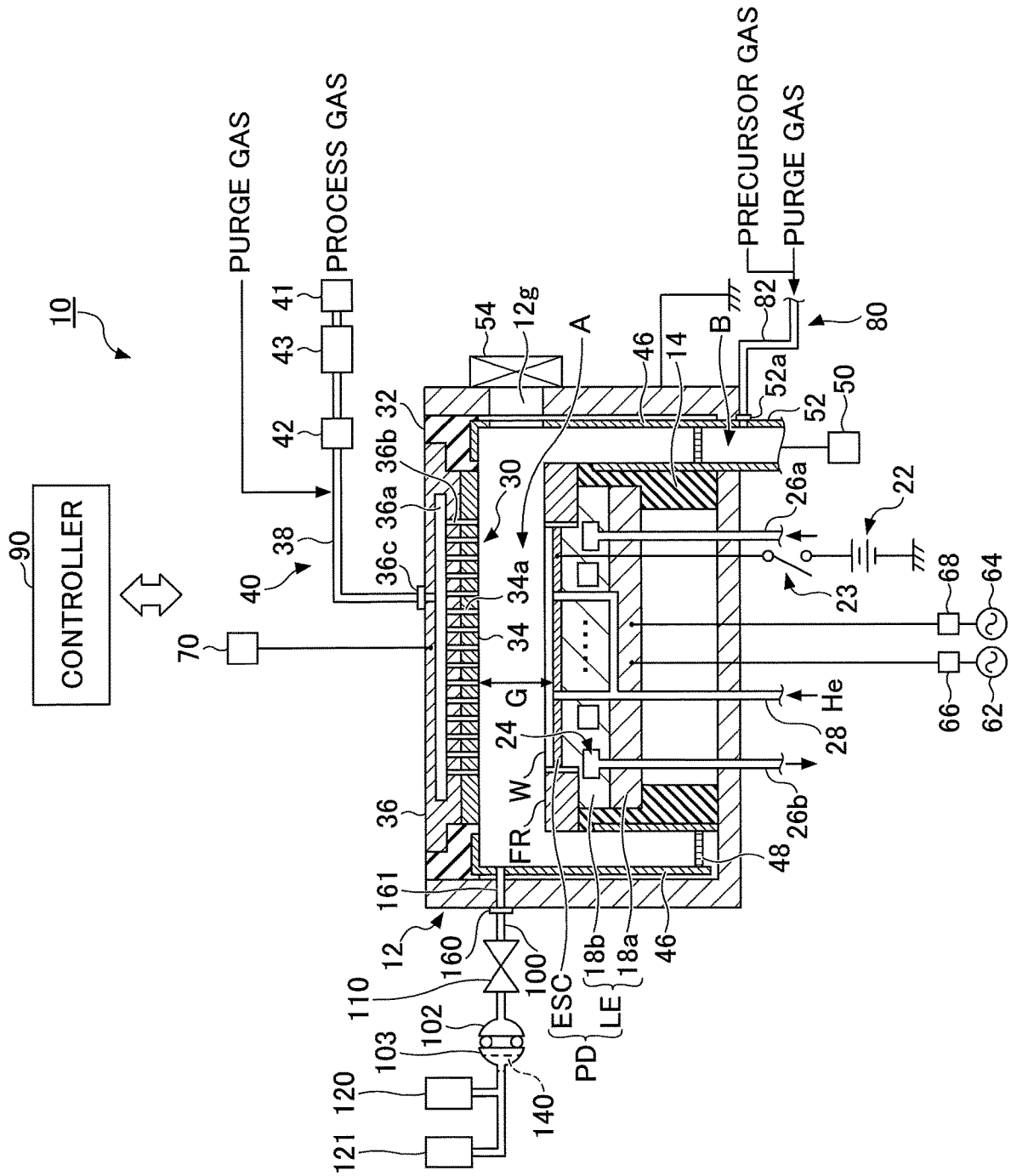
FIG. 6 is a schematic cross-sectional view illustrating a plasma processing apparatus according to the present embodiment.

FIG. 6 is a schematic cross-sectional view illustrating a plasma processing apparatus according to the present embodiment.

As shown in FIG. 6, the plasma processing apparatus 10 is a capacitively coupled plasma etching apparatus with an approximately cylindrical shaped processing chamber 12. The inner wall surface of the processing chamber 12 is made, for example, of anodized aluminum. The processing chamber 12 is grounded.

An approximately cylindrical shaped support 14 is provided on the bottom of the processing chamber 12. The support 14 is made of, for example, an insulating material. The support 14 extends vertically from the bottom of the processing chamber 12 in the processing chamber 12. A pedestal PD is provided in the processing chamber 12. The pedestal PD is supported by the support 14.

The pedestal PD holds the wafer W on its top surface. The pedestal PD includes a lower electrode LE and an electrostatic chuck ESC. The lower electrode LE includes a first plate 18a and a second plate 18b. The first plate 18a and the second plate 18b are formed into an approximately disc-shaped form, for example, and are made of a metal such as aluminum. The second plate 18b is provided on the first plate 18a and is electrically connected to the first plate 18a.

The electrostatic chuck ESC is provided on the second plate 18b. The electrostatic chuck ESC has a structure including an electrode, which is made of a conductive film, and is disposed between a pair of insulating layers or insulating sheets. A DC power supply 22 is electrically connected to the electrostatic chuck ESC electrode via a switch 23. The electrostatic chuck ESC adsorbs the wafer W by electrostatic forces such as Coulomb forces generated by the DC voltage from the DC power supply 22. This allows the electrostatic chuck ESC to hold the wafer W.

A focus ring FR is disposed on the periphery of the second plate 18b while surrounding the edge of the wafer W and the electrostatic chuck ESC. The focus ring FR is provided to improve the uniformity of the etching. The focus ring FR is made of a material selected depending on the material of the film to be etched, such as silicon or quartz.

The interior of the second plate 18b includes a refrigerant flow passage 24 that functions as a temperature control mechanism. A refrigerant is supplied to the refrigerant flow passage 24 through a pipe 26a from a chiller unit disposed outside the processing chamber 12, and the refrigerant supplied to the refrigerant flow passage 24 is returned to the chiller unit through the pipe 26b. That is, the refrigerant is supplied to the refrigerant flow passage 24 to circulate the refrigerant flow passage 24. The temperature of the wafer W held by the electrostatic chuck ESC is also controlled by adjusting the temperature of the refrigerant supplied to the refrigerant flow path 24.

The plasma processing apparatus 10 includes a gas supply line 28. The gas supply line 28 supplies heat transfer gas, for example, helium (He) gas, from the heat transfer gas supply mechanism to a location between the top surface of the electrostatic chuck ESC and the backside of the wafer W.

The plasma processing apparatus 10 includes an upper electrode 30. The upper electrode 30 is arranged to face the pedestal PD above the pedestal PD. The lower electrode LE and the upper electrode 30 are substantially parallel to each other. A processing space A is formed between the upper electrode 30 and the lower electrode LE to perform a plasma process on the wafer W.

The upper electrode 30 is supported at an upper location of the processing chamber 12 via an insulating shielding member 32. The upper electrode 30 is configured such that, for example, the distance G in the vertical direction from the top surface of the pedestal PD is variable. The upper electrode 30 includes an electrode plate 34 and an electrode support 36. The electrode plate 34 faces the processing space A, and the electrode plate 34 has a plurality of gas discharge holes 34a. The electrode plate 34 is made, for example, of silicon. The electrode plate 34 illustrated in FIG. 6 is formed into a flat plate, but may have a tapered shape such that the distance G between the upper electrode 30 and the upper surface of the pedestal PD decreases toward the outer peripheral portion.

The electrode support 36 removably supports the electrode plate 34 and is made of a conductive material such as aluminum, for example. The electrode support 36 may have a water-cooled structure. The electrode support 36 includes a gas diffusion chamber 36a thereinside. A plurality of gas flow holes 36b in communication with the gas discharge holes 34a extend downward in the gas diffusion chamber 36a. Further, the electrode support 36 has a gas inlet 36c that leads the process gas to the gas diffusion chamber 36a, and a gas supply line 38 is connected to the gas inlet 36c.

The gas supply line 38 is connected to a group of process gas sources 41 via a group of valves 42 and a group of flow controllers 43. This allows the process gas to be supplied to the processing space A. The group of process gas sources 41 includes a source of reactive gas, such as a source of oxygen-containing gas, a source of nitrogen-containing gas, and a source of etching gas. The oxygen-containing gases are, for example, oxygen ($O_2$) gas, ozone ($O_3$) gas, carbon monoxide (CO) gas, and carbon dioxide ($CO_2$) gas. The nitrogen-containing gases are, for example, nitrogen ($N_2$) gas and ammonia ($NH_3$) gas. The etching gas is a fluorocarbon gas such as $C_4F_8$ gas and $C_4F_8$ gas.

A purge gas source is also connected to the gas supply line 38. This allows purge gas to be supplied to the processing space A. The purge gas is an inert gas such as noble gas or $N_2$ gas. The noble gases are, for example, argon (Ar) gas, helium (He) gas, krypton (Kr) gas, and xenon (Xe) gas.

The group of valves 42 includes a plurality of valves, and the group of flow controllers 43 includes a plurality of flow controllers, such as mass flow controllers. The plurality of gas sources of the group of process gas sources 41 is connected to the gas supply line 38 via corresponding valves of the group of valves 42 and corresponding flow controllers of the group of flow controllers 43, respectively.

The gas outlet holes 34a, the gas diffusion chamber 36a, the gas flow holes 36b, the gas inlet 36c, the gas supply line 38, the group of process gas sources 41, the group of valves 42, the group of flow controllers 43, and the purge gas source constitute a first gas supply part 40.

The plasma processing apparatus 10 removably includes a deposition shield 46 along the inner wall of the processing chamber 12. A deposition shield 46 is also provided on the outer periphery of the support 14. The deposition shields 46 prevent a by-product generated by etching from adhering to the processing chamber 12, and is formed, for example, by coating aluminum with a ceramic such as $Y_2O_3$.

A pipe 100 is provided on a lateral surface of the processing chamber 12, and capacitance manometers 120 and 121 are provided through isolation valves 110 and flange joints 102 and 103. The capacitance manometers 120 and 121 include a low vacuum capacitance manometer 120, and a high vacuum capacitance manometer 121. The pipe 100 is connected to the processing chamber 12 via a gas inlet 160 and further communicates with the processing space A inside the deposition shield 46 via an adapter 161 to measure the gas pressure in the processing space A.

Flange joints 102 and 103 are provided downstream of an isolation valve 110, and a radical deactivation component 140 is provided in the flange joints 102 and 103. This allows a reaction assist gas, that is, the oxygen-containing gas radicals and the nitrogen-containing gas radicals described above, to be deactivated by the radical deactivation component when measuring the pressure in the process chamber 12 with capacitance manometers 120 and 121, and to inhibit deposits from adhering to the diaphragm 124 (see FIG. 2) in the capacitance manometers 120 and 121.

The radical deactivation component 140 may be a radical deactivation component 140a, 140b according to the second or third embodiment, or may be a radical deactivation component according to another embodiment. However, for convenience of explanation, an example of using the radical deactivation component 140 according to the first embodiment is described herein.

A baffle plate 48 having a number of exhaust holes is provided around the pedestal PD to uniformly evacuate the processing chamber 12. The baffle plate 48 is formed, for example, by coating aluminum with a ceramic such as $Y_2O_3$, and serves to block a gas converted to plasma. Below the baffle plate 48, an exhaust space B is formed to surround the pedestal PD. That is, the exhaust space B communicates with the processing space A through the baffle plate 48. The baffle plate 48 may be vertically movable around the pedestal PD.

The processing space A is connected from the exhaust space B to an exhaust device 50 including a vacuum pump, such as a turbo molecular pump, via an exhaust line 52. Then, the exhaust device 50 evacuates the gas in the processing space A of the processing chamber 12 and discharges the gas to the exhaust space B, and the gas is emitted outside through the exhaust line 52. Accordingly, the processing space A in the processing chamber 12 can be reduced to a predetermined degree of vacuum. In addition, because the conductance in the portion including the baffle plate 48 is low, the exhaust space B has a pressure that is a predetermined percentage lower than the pressure in the processing space A. The predetermined ratio may vary depending on a number, a size and the like of the numerous exhaust holes provided on the baffle plate 48, and may be, for example, 30% or more.

The exhaust pipe 52 has a gas inlet 52a that introduces a film deposition source (precursor) gas to the exhaust space B. A gas supply line 82 is connected to the gas inlet 52a.

A precursor gas source and a purge gas source are connected to the gas supply line 82 via valves, flow controllers, and the like (which are not illustrated in the drawing). This allows precursor gas and/or purge gas to be supplied from the gas supply line 82 to the exhaust space B. The precursor gas may be, for example, a silicon-containing gas. Silicon-containing gases include amino-silane-based gases such as BTBAS (Bistar-Chaributylaminosilane), BDMAS (bis-dimethylaminosylaminosilane), BDEAS (bis-diethylaminosilane), DMAS (dimethylaminosilane), DEAS (diethylaminosilane), DPAS (dipropylaminosilane), BAS (butylaminosilane), DIPAS (diisopropylaminosilane), and BEMAS (bis-ethylmethylaminosilane), silicon halide gases such as TEOS (tetraethoxysilane), $SiCl_4$, $SiF_4$, and the like. The purge gas is a noble gas or $N_2$ gas. The noble gases are, for example, Ar gas, He gas, Kr gas, and Xe gas.

A gas inlet 52a, a gas supply line 82, a precursor gas source and a purge gas source constitute a second gas supply 80.

The side wall of the processing chamber 12 also has a transfer port 12g of the wafer W. The transfer port 12g can be opened and closed by a gate valve 54.

The plasma processing apparatus 10 also includes a first RF power supply 62 and a second RF power supply 64. The first radio frequency power source 62 is a power source that generates a first high frequency power for plasma generation, while generating high frequency power at a frequency of 27-100 MHz, for example, 40 MHz. The first radio frequency power supply 62 is connected to the lower electrode LE via a matching box 66. The matching box 66 is a circuit for matching the output impedance of the first RF power supply 62 with the input impedance of the load side (lower electrode LE side). The first radio frequency power supply 62 may be connected to the upper electrode 30 via the matching box 66.

The second radio frequency power supply 64 is a power source that generates a second high frequency power, that is, high frequency bias power, to attract ions to the wafer W, and generates high frequency bias power at frequencies in the range of 400 kHz to 13.56 MHz, for example, 13 MHz. A second radio frequency power supply 64 is connected to the lower electrode LE via a matching box 68. The matching box 68 is a circuit for matching the output impedance of the second RF power supply 64 with the input impedance of the load side (lower electrode LE side).

The plasma processing apparatus 10 also includes a power supply 70. The power supply 70 is connected to the upper electrode 30. The power supply 70 applies a voltage to the upper electrode 30 for attracting positive ions present in the processing space A to the electrode plate 34. The power supply 70 is, for example, a DC power source that generates a negative DC voltage. The power supply 70 may be an AC power source that generates a relatively low frequency AC voltage. The voltage applied from the power supply 70 to the upper electrode 30 is, for example, a voltage of 150 V or more. When a voltage is applied from the power supply 70 to the upper electrode 30, positive ions present in the processing space A collide with the electrode plate 34. This releases secondary electrons and/or silicon from the electrode plate 34. The emitted silicon molecule binds to the fluorine active species present in the processing space A, while reducing the amount of fluorine active species.

The plasma processing apparatus 10 also includes a controller 90. The controller 90 is a computer including a processor, a storage unit, an input device, a display device and the like, and controls each portion of the plasma processing apparatus 10. In the controller 90, the input device can be used to input commands or the like to manage the plasma processing apparatus 10 by an operator or the like. In the controller 90, the operation status of the plasma processing apparatus 10 can be visualized and displayed by the display device. Further, the storage unit of the controller 90 stores a control program for controlling various processes performed by the plasma processing apparatus 10 by the processor or a program for causing each part of the plasma processing apparatus 10 to execute the process according to the processing conditions, that is, a process recipe.

In the meantime, a plasma processing apparatus capable of supplying aminosilane-based gas has a so-called post-mix structure that separates the supply pipe of the aminosilane-based gas from the supply pipe of another process gas (e.g., oxygen gas). This is because the reactivity of the aminosilane gas is high, and when the same pipe is used to supply the aminosilane gas and another process gas, the aminosilane gas adsorbed in the pipe reacts with another process gas, thereby depositing a reaction product. The reaction product deposited in the pipe causes particles. In addition, the reaction product deposited in the pipe is difficult to be removed by cleaning. Furthermore, if the pipe is located close to the plasma region, it can cause abnormal discharge.

However, even a plasma processing apparatus with a post-mix structure is liable to penetrate other process gas supply lines if the plasma processing apparatus supplies the aminosilane-based gas and does not supply another process gas. Accordingly, in order to prevent the intrusion of the aminosilane gas into the supply line of the other process gas, inert gas is flowed as purge gas into the supply line of the other process gas when no other process gas is supplied.

In addition, even a plasma processing apparatus having a post-mix structure, if another process gas is supplied without supplying aminosilane-based gases, the other process gas is liable to intrude into the supply pipe of the aminosilane-based gases. Accordingly, in order to prevent the intrusion of other process gases into the supply pipe of the aminosilane-based gas, an inert gas is flowed as a purge gas into the supply pipe of the aminosilane-based gas while the aminosilane-based gas is not supplied.

However, when the ALD deposition process and the etching process are performed using the same plasma processing apparatus, the purge gas supplied from the pipe to supply the aminosilane gas may act as an additive gas in the etching process. When the purge gas acts as the additive gas in the etching process, a preferable etched feature may not be obtained due to a decrease in mask selectivity ratio or an increase in LER (Line Edge Roughness).

In the plasma processing apparatus according to the embodiments of the present disclosure, a second gas supply part 80 is provided that can supply a precursor gas to the exhaust space B, which is in communication with the processing space A to which a process gas converted to plasma is supplied, via the baffle plate 48. Thus, the process gas converted to plasma and supplied to processing space A is blocked by the baffle plate 48 so that the process gas plasma is hardly supplied to the exhaust space B and hardly reaches the gas supply line 82 of the second gas supply part 80. Therefore, in the gas supply line 82, the precursor gas can react with the process gas plasma to inhibit the formation of the reaction product.

In the plasma processing apparatus according to the embodiments of the present disclosure, the second gas supply part 80 is provided in the exhaust space B. Therefore, even if the second gas supply part 80 supplies a purge gas when not supplying the precursor gas, the purge gas hardly reaches the processing space A. Therefore, in the etching process, the purge gas does not act as an additive gas, so that the mask selective ratio does not decrease or that the LER does not increase, and can obtain a preferable etching feature.

[Plasma Processing Method]

Next, a plasma processing method using a plasma processing apparatus according to the present embodiment is described below. The plasma processing method using the plasma processing apparatus according to this embodiment includes a deposition step and an etching step. The deposition step includes an adsorption step and a reaction step. The adsorption step is to adsorb the precursor gas to the surface of the wafer W by supplying the precursor gas to the exhaust space B and supplying the inert gas to the processing space A. The reaction step is a step of producing a reaction product of the precursor gas and the reaction gas by supplying the reaction gas that reacts with the precursor gas to the processing space A. The etching step is to perform etching by supplying an etching gas to the processing space A. Further, when switching between the respective steps, a purge step may be performed to replace the residual precursor gas, reaction gas, and etching gas in the processing space A by a purge gas by supplying the purge gas to the processing space A.

Hereinafter, an example is described below in which a silicon oxide film is deposited by an ALD method and a plasma etching is performed using the above-mentioned plasma processing apparatus 10. Specifically, a wafer W with a film to be etched and a resist pattern is prepared at first. The silicon oxide film is then formed by the ALD method to cover the surface of the resist pattern. The desired fine pattern is then formed by etching the film to be etched by plasma etching. The following plasma processing method is performed by controlling the operation of each part of the plasma processing apparatus 10 by the controller 90.

Figure 7:
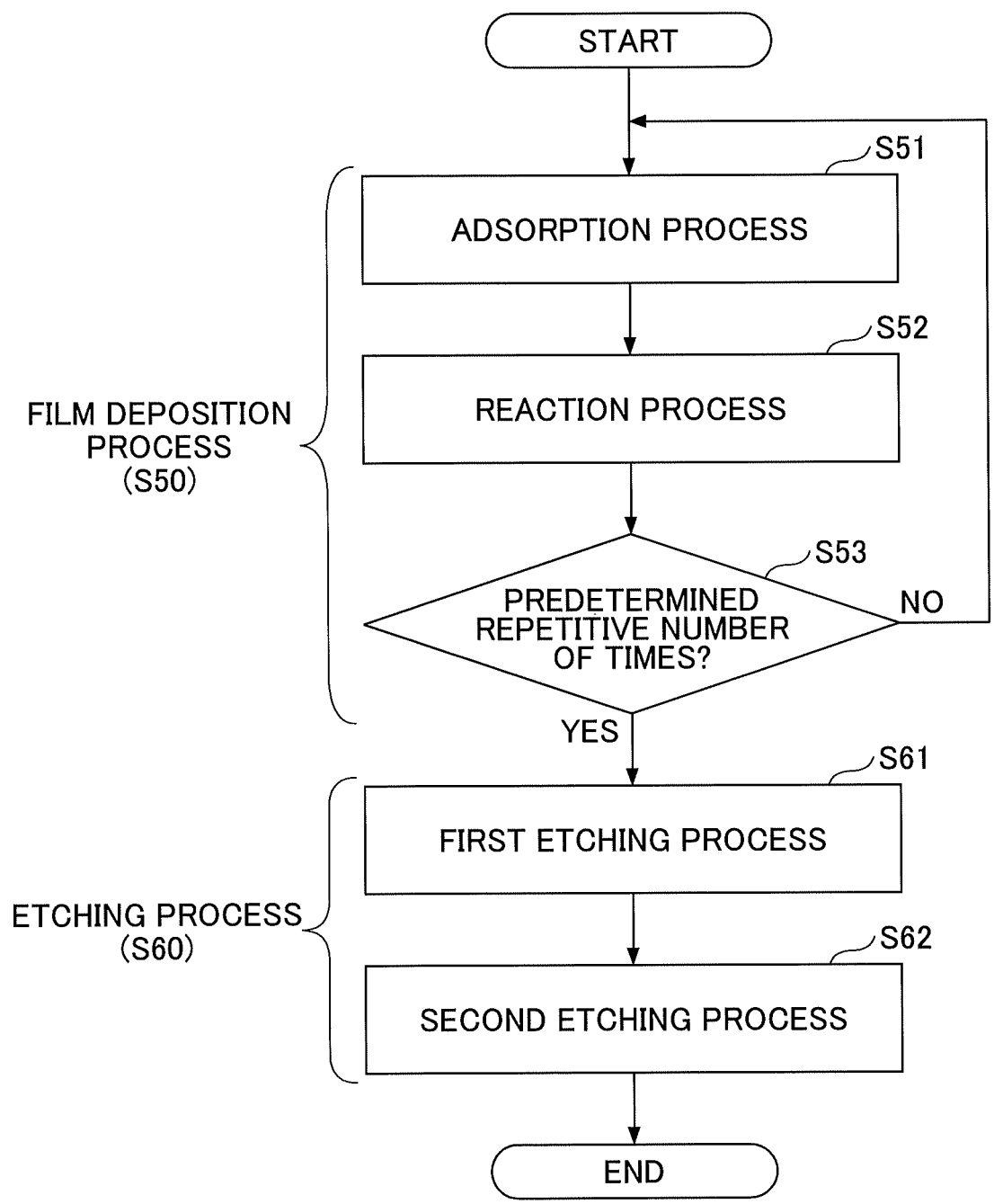
FIG. 7 is a flow chart illustrating a plasma processing method using a plasma processing apparatus according to the present embodiment.

FIG. 7 is a flow chart illustrating a plasma processing method using a plasma processing apparatus according to the present embodiment. As illustrated in FIG. 7, the plasma processing method in this embodiment includes a deposition step S50 for depositing a silicon oxide film by ALD and an etching step S60 for performing plasma etching.

During the implementation of such a plasma processing method, the pressure in the processing chamber 12 is measured continuously or for a predetermined period of time using the capacitance manometers 120 and 121. This allows the plasma processing to be performed under appropriate pressure conditions.

The film deposition step S50 includes an adsorption step S51, a reaction step S52, and a determination step S53.

The adsorption step S51 is a step of adsorbing an aminosilane gas on a resist pattern by supplying the aminosilane gas. In the adsorption step S51, the aminosilane gas is supplied from the second gas supply part 80 to the exhaust space B, and an inert gas is supplied from the first gas supply part 40 to the processing space A.

On this occasion, the aminosilane gas reaches the capacitance manometers 120 and 121 through the adapter 161, the pipe 100, the isolation valve 110, the flange joints 102 and 103, and the radical deactivation component 140, and the pressure in the processing chamber 12 is measured. The aminosilane gas also adsorbs on the diaphragm 124 (see FIG. 2), but does not form a deposit alone. That is, the reaction product is not formed unless the aminosilane gas reacts with the radicals of the reaction gas.

The reaction step S52 is a step of depositing the silicon oxide film by reacting the aminosilane gas adsorbed on the resist pattern with the plasma oxygen gas by supplying oxygen gas converted to plasma. In the reaction step S52, oxygen gas is supplied from the first gas supply part 40 to the processing space A, and an inert gas is supplied from the second gas supply part 80 to the exhaust space B. Also, the first radio frequency power from the first radio frequency power supply 62 is supplied to the lower electrode LE to convert the supplied oxygen gas to plasma. At this time, a baffle plate 48 is provided to block the oxygen gas plasma between the processing space A and the exhaust space B. Thus, the baffle plate 48 blocks the oxygen gas plasma supplied to the processing space A so that the oxygen gas plasma is hardly supplied to the exhaust space B and hardly reaches the gas supply line 82 of the second gas supply 80. Accordingly, in the gas supply line 82, it is possible to prevent the reaction product from being formed by reaction of the precursor gas with the plasma oxygen gas. Also, since it is not necessary to draw ions from the plasma, it is desirable that the second radio frequency power supply 64 does not supply power to the lower electrode LE.

Here, the oxygen gas plasma, or oxygen radicals, reaches or reach the radical deactivation component 140 in the flange joints 102 and 103 via adapters 161, the pipe 100, and the isolation valve 110. The oxygen radicals pass the value 110 through the bending path 143 from the inlet 144 illustrated in FIG. 3, while decreasing energy as the oxygen radicals collide with the inner wall in the bending path 143, and being deactivated until the oxygen radicals reach the outlet 145, and becomes oxygen gas. Thus, oxygen gas adsorbs on the diaphragm 124 of the capacitance manometers 120 and 121, but does not react with the aminosilane gas that has already adsorbed on the surface of the diaphragm 124, and does not produce a reaction product. Accordingly, no deposits are formed and no deposits are deposited on the diaphragm 124. Accordingly, no zero point shifts of capacitance manometers 120 and 121 occur and the pressure in the processing chamber 12 can be measured in good conditions.

The determination step S53 is a step of determining whether or not a predetermined number of times of repetition of the adsorption steps and the reaction steps have occurred after starting the deposition process. When it is determined that the predetermined number of cycles of the adsorption steps and the reaction steps have occurred in the determination step S53, the film deposition step S50 is completed, and then the etching step S60 is performed. When it is determined that the predetermined number of times of repetition of the adsorption steps and the reaction steps has not occurred in the determination step S53, the process returns to the adsorption step S51. The number of repetitions is preliminarily determined depending on the thickness of the film to be deposited.

As described above, in the film deposition step S50, the adsorption step S51 and the reaction step S52 are repeated until a predetermined number of repetitions have occurred, so that a silicon oxide film having the desired film thickness is deposited.

The etching step S60 includes a first etching step S61 and a second etching step S62.

In the first etching step S61, by supplying the first etching gas, the silicon oxide film remains on the side wall of the resist pattern, and the silicon oxide film formed on the top surface of the resist pattern is removed. In the first etching step S61, a first etching gas is supplied from the first gas supply part 40 to the processing space A, and a second gas supply part 80 supplies an inert gas to the exhaust space B. The first etching gas can be an etching gas that can readily etch the silicon oxide film than the resist pattern, such as $CF_4$ or $CF_4F_8$, or hydrofluorocarbons such as $CHF_3$ or $CH_2F_2$. Also, the first radio frequency power from the first radio frequency power supply 62 is supplied to the lower electrode LE, and the second radio frequency power from the second radio frequency power supply 64 is supplied to the lower electrode LE. The silicon oxide film remaining on the side walls of the resist pattern serves to prevent the width of the resist pattern from narrowing in the second etching step S62. This is because the silicon oxide film remaining on the side walls of the resist pattern can prevent atoms or plasma ions from colliding with the side walls of the resist pattern.

In the second etching step S62, a pattern of the film to be etched is formed by etching the film to be etched using a resist pattern as an etching mask while supplying the second etching gas. In the second etching step S62, a second etching gas is supplied from the first gas supply part 40 to the processing space A and from the second gas supply part 80 to the exhaust space B. The second etching gas can be an etching gas that can readily etch the resist pattern than the silicon oxide film, such as $O_2$ or $H_2/N_2$. Thus, when etching the film to be etched, the etching rate of the silicon oxide film is low, while the etching rate of the resist pattern is high, and causes damage to the resist pattern. When the resist pattern is damaged, the resist material and the etching gas react to form a polymer of organic material. For example, such a polymer can be a material containing carbon and fluorine. When a polymer is formed, a polymer film is formed on the top of the resist pattern. The polymer film prevents further damage to the underlying resist pattern.

In the first and second etching steps S61 and S62, the pressure in the processing chamber 12 can be measured without any problem because the deposits are not likely to adhere to the diaphragm 124 of the capacitance manometers 120 and 121.

As described above, according to the plasma processing apparatus according to the present embodiment, even in a process including the etching process and the film forming process performed in the same processing chamber, the pressure can be appropriately measured and the plasma process can be performed under appropriate pressure conditions.

In the present embodiments, an example of using a radical deactivation component 140 is described in the plasma processing apparatus that combines the etching process and the film deposition process. However, it is needless to say that it is also suitably applicable to the plasma processing apparatus that performs the film deposition process. The film deposition process is not limited to ALD, but can also be applied to various deposition processes using plasma such as CVD.

EXAMPLE

Next, the measurement results of the conductance using the radical deactivation component 140 according to the present embodiment and the conventional trap are described below.

As described above, traps to trap by-products in the exhaust system, for example, as described in U.S. Pat. No. 7,871,587, have been present. The adherence of deposits on the diaphragm 124 can be prevented by disposing the conventional trap upstream of capacitance manometers 120 and 121.

However, when such a trap is used, the conductance of the gas decreases and the pressure measurement is not sufficiently responsive. Hence, the inventors have created the radical deactivation components 140, 140a, and 140b according to the present embodiments.

In this example, the responsiveness of the pressure measurement between the spiral trap described in U.S. Pat. No. 7,871,587 and the radical deactivation component 140 according to this embodiment was compared.

Figure 8:
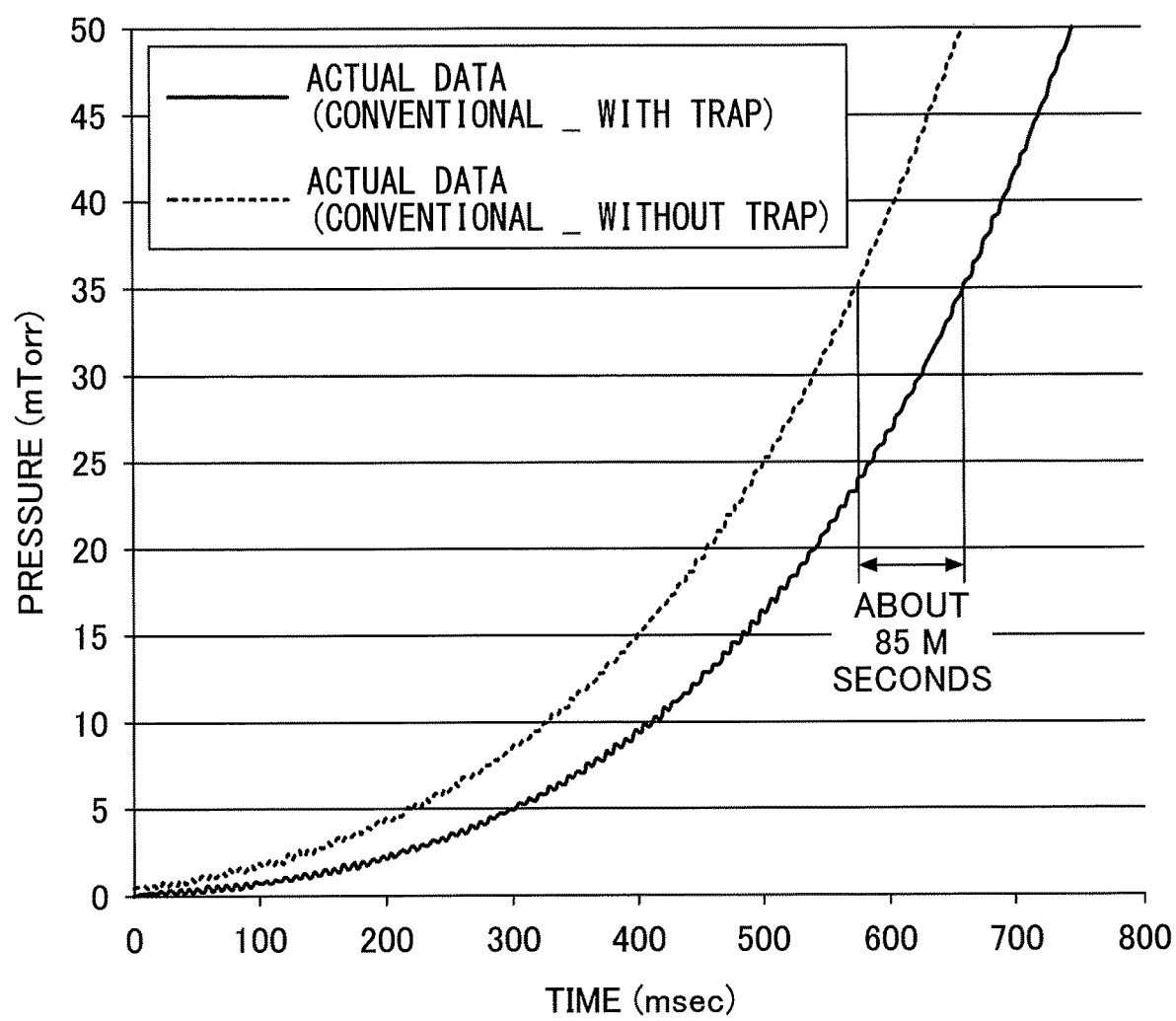
FIG. 8 is an actual measurement of the time delay of pressure measurement using a conventional spiral trap.

FIG. 8 shows actual measurement values of the time delay of pressure measurement using a conventional spiral trap. In FIG. 8, the horizontal axis shows time (millisecond), and the vertical axis shows pressure (mTorr). As shown in FIG. 8, at a pressure of 35 mTorr, a time delay of pressure measurement of about 85 milliseconds occurred when a trap with a conventional spiral flow path was used, compared with the case without a trap. In other words, the actual pressure was 35 mTorr, and a time delay of about 85 milliseconds occurred to reach the measured value. This is probably because the use of the conventional trap reduces conductance, and prevents the gas flow from being trapped.

Figure 9:
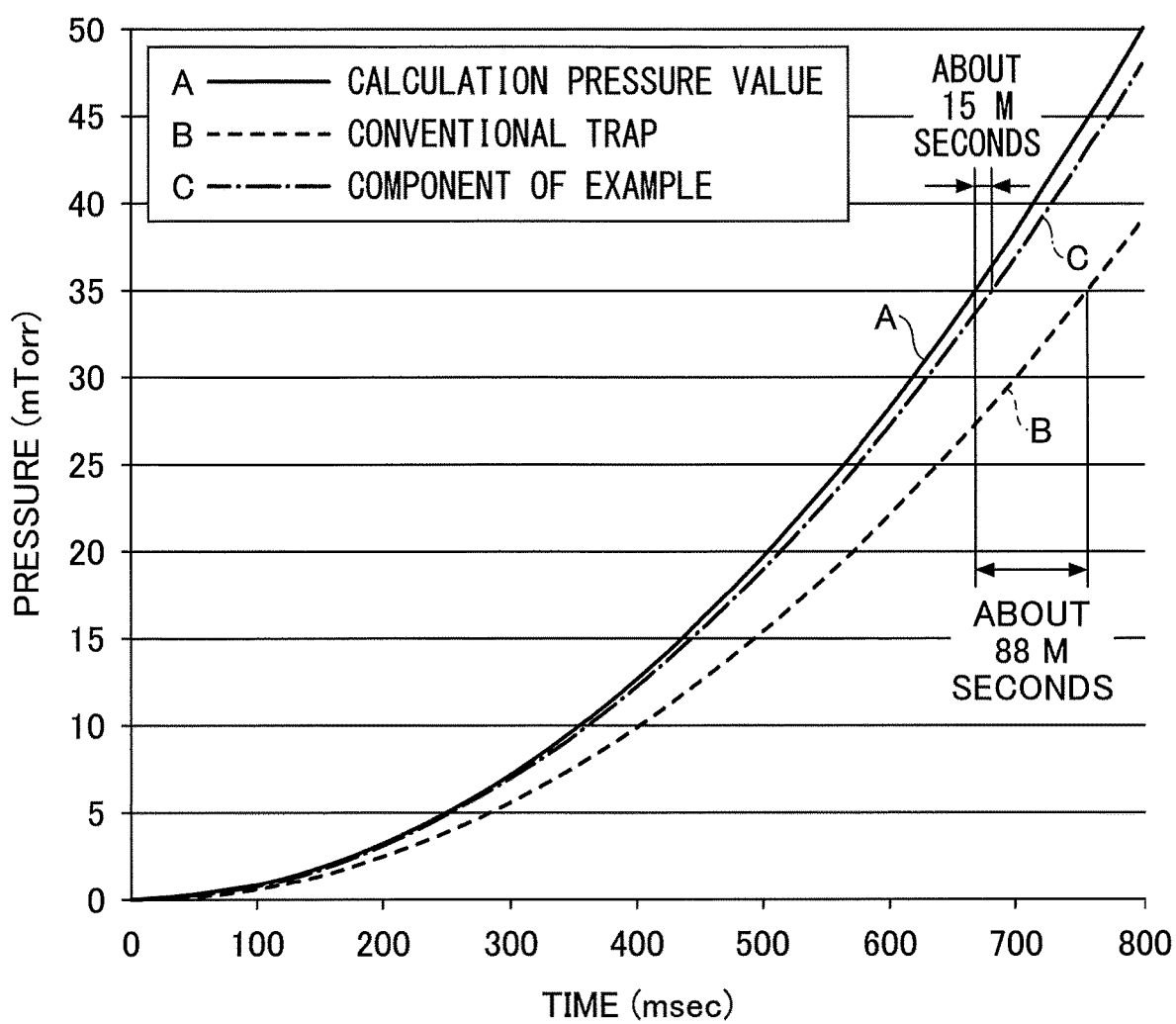
FIG. 9 is a diagram illustrating a simulation result comparing responsiveness of the pressure measurement of a radical deactivation component according to the present embodiment with responsiveness of the pressure measurement of a conventional helical trap.

FIG. 9 is a graph showing the results of a simulation experiment of comparatively measuring the responsiveness of the pressure measurement of the radical deactivation component 140 according to the present embodiment when a simulation condition of a conventional helical trap is set close to the actual measured value of FIG. 8. The radical deactivation component 140 according to the first embodiment was used as the radical deactivation component 140.

In FIG. 9, a characteristic A shows the calculated pressure value approximating to the actual measured value when no trap is provided; a characteristic B shows the calculated pressure value when a trap of a conventional helical shape is provided; and a characteristic C shows the calculated pressure value when a radical deactivation component 140 according to the present embodiment is provided.

As shown in FIG. 9, in the case of a pressure value of 35 mTorr, a time delay of about 88 millisecond occurred for the trap-free characteristic A in the conventional spiral shape of characteristic B, whereas in the radical deactivation component 140 of the characteristic C, only a time delay of about 15 msec occurred, and the responsiveness greatly improved. Thus, the results of this embodiment show that the radical deactivation component 140 according to the embodiment can prevent deposition on the diaphragm 124 without lowering conductance and can significantly improve the responsiveness of the pressure measurement.

Thus, the radical deactivation component and the plasma processing apparatus, and the radical deactivation method according to the present embodiment can efficiently deactivate the radicals of the assist gas without lowering the conductance of the gas, thereby preventing the measurement failure due to the deposition of a deposit on part of the measuring instrument. In the embodiments, an example in which a capacitance manometer and a pressure determination switch are subject to protection has been described. However, the present disclosure can be applied to all measuring instruments and devices that require radical deactivation, and the present disclosure can be applied to various devices and equipment that perform plasma processing.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present disclosure have been described in detail, it should be understood that various changes, substitutions, and alterations could be made hereto without departing from the spirit and scope of the invention.

What is claimed is:

1. A plasma processing apparatus, comprising:
a plasma processing chamber;
at least one instrument:
first and second pipes disposed between the plasma processing chamber and the at least one instrument, the first pipe having a first conduit, the second pipe having a second conduit, the first conduit being in fluid communication with the plasma processing chamber, the second conduit being in fluid communication with the at least one instrument;
an O-ring disposed between the first pipe and the second pipe; and
first and second components at least partially disposed in a space surrounded by the O-ring, the first component having a first engagement portion engaged with the first pipe, the second component having a second engagement portion engaged with the second pipe, a path being formed between the first component and the second component, the path being in fluid communication with the first conduit and the second conduit, the path having a first portion, a second portion and at least one turnaround portion, the first portion being in fluid communication with the first conduit, the second portion being in fluid communication with the second conduit, the at least one turnaround portion being disposed between the first portion and the second portion, the first portion and the second portion extending parallel to the first and second pipes, the first portion including an inlet facing the first conduit and without facing the second conduit, the second portion including an outlet facing the second conduit and without facing the first conduit, the at least one turnaround portion being disposed closer to a central axis of the first and second pipes in a radial direction of the first and second pipes than the inlet.

2. The plasma processing apparatus according to claim 1, wherein the at least one turnaround portion comprises a plurality of turnaround portions.

3. The plasma processing apparatus according to claim 2, wherein the first pipe comprises a first flange portion, and the second pipe comprises a second flange portion,
wherein the O-ring is sandwiched between the first flange portion and the second flange portion, and
wherein the first component is attached to the first flange portion, and the second component is attached to the second flange portion.

4. The plasma processing apparatus according to claim 3, wherein the at least one instrument comprises a pressure measuring instrument configured to measure a pressure in the plasma processing chamber.

5. The plasma processing apparatus according to claim 4, wherein the pressure measuring instrument comprises a capacitance manometer including a diaphragm.

6. The plasma processing apparatus according to claim 1 wherein the first pipe comprises a first flange portion, and the second pipe comprises a second flange portion, wherein the O-ring is sandwiched between the first flange portion and the second flange portion, and wherein the first component is attached to the first flange portion, and the second component is attached to the second flange portion.

7. The plasma processing apparatus according to claim 6, wherein the at least one instrument comprises a pressure measuring instrument configured to measure a pressure in the plasma processing chamber.

8. The plasma processing apparatus according to claim 7, wherein the pressure measuring instrument comprises a capacitance manometer including a diaphragm.

9. The plasma processing apparatus according to claim 7, wherein the at least one turnaround portion comprises a plurality of turnaround portions.

10. The plasma processing apparatus according to claim 1 wherein the at least one instrument comprises a pressure measuring instrument configured to measure a pressure in the plasma processing chamber.

11. The plasma processing apparatus according to claim 1 wherein the pressure measuring instrument comprises a capacitance manometer including a diaphragm.

12. The plasma processing apparatus according to claim 1 wherein the at least one turnaround portion comprises a plurality of turnaround portions.

13. The plasma processing apparatus according to claim 1 wherein the at least one instrument includes a diaphragm.

14. The plasma processing apparatus according to claim 13, wherein the first portion is disposed outside of the second portion.

15. The plasma processing apparatus according to claim 14, wherein a diameter of the first pipe (100a) is greater than a diameter of the second pipe.

16. The plasma processing apparatus according to claim 1 wherein the first portion is disposed outside of the second portion.

17. The plasma processing apparatus according to 1 wherein a diameter of the first pipe is greater than a diameter of the second pipe.

* * * * *